(12) United States Patent
Nagata (10) Patent No.: US 7,635,619 B2
(45) Date of Patent: Dec. 22, 2009

(54) THIN FILM TRANSISTOR, METHOD OF MANUFACTURING THE THIN FILM TRANSISTOR, AND DISPLAY DEVICE

(75) Inventor: Hitoshi Nagata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 112 days.

(21) Appl. No.: 11/733,925

(22) Filed: Apr. 11, 2007

(65) Prior Publication Data

US 2007/0241334 A1    Oct. 18, 2007

(30) Foreign Application Priority Data

Apr. 12, 2006   (JP) .............................. 2006-109904

(51) Int. Cl.
*H01L 21/336* (2006.01)

(52) U.S. Cl. ............... 438/197; 257/402; 257/E29.299; 257/E21.409

(58) Field of Classification Search ................ 438/151, 438/152, 197, 585, 586; 257/402, 405, E29.299, 257/E51.006

See application file for complete search history.

(56) References Cited

U.S. PATENT DOCUMENTS

2005/0082539 A1 * 4/2005 Fujimoto et al. ............... 257/72

FOREIGN PATENT DOCUMENTS

| JP | 60-157258 | 8/1985 |
| JP | 9-181317 | 7/1997 |
| JP | 2003-140570 | 5/2003 |
| JP | 2004-327664 | 11/2004 |

* cited by examiner

*Primary Examiner*—W. David Coleman
*Assistant Examiner*—Daniel Shook
(74) *Attorney, Agent, or Firm*—Oblon, Spivak, McClelland, Maier & Neustadt, L.L.P.

(57) ABSTRACT

A thin film transistor according to an embodiment of the present invention includes: a semiconductor layer formed on a substrate and having a first diffusion region, a channel region, and a second diffusion region; a gate electrode opposite to the semiconductor layer across a gate insulating film formed on the semiconductor layer; and a connecting conductive film formed on the semiconductor layer opposite to the gate insulating film and extending from the first diffusion region up to a predetermined position in the channel region to electrically connect between the first diffusion region and the channel region. The transistor further includes a laying conductive layer formed on the semiconductor layer opposite to the gate insulating film and electrically connected with the second diffusion region.

16 Claims, 6 Drawing Sheets

RELATED ART

Fig. 10

RELATED ART

Fig. 11

THIN FILM TRANSISTOR, METHOD OF MANUFACTURING THE THIN FILM TRANSISTOR, AND DISPLAY DEVICE

BACKGROUND OF THE INVENTION

1. Field of the Invention

The present invention relates to a thin film transistor, a method of manufacturing the thin film transistor, and a display device.

2. Description of Related Art

High performances have been required of thin film transistors (hereinafter referred to as "TFTs") used in organic EL display devices or liquid crystal display devices along with an increase in image quality of display devices. In particular, in the organic EL display devices, how to control analog signals is important. TFTs used in an analogue circuit need to have stability in a saturation region of current-voltage characteristics. Incidentally, the current-voltage characteristics refer to drain current (Id)-source-drain voltage (Vds) characteristics.

Figure 10:
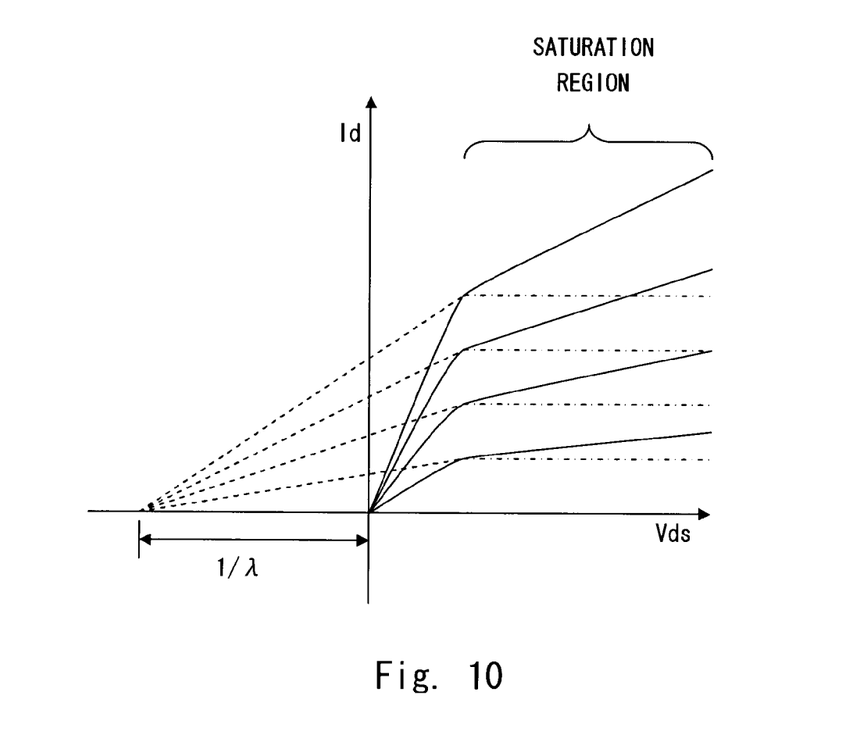
FIG. 10 is a graph of a relation of thin film transistor Id-Vds characteristics.

FIG. 10 is a graph showing a relation of Id-Vds characteristics. The graph illustrates an amount of a current Id flowing through a drain region of a TFT relative to a voltage Vds applied between a source region and a drain region, in which different values of a voltage Vgs applied between a source region and a gate electrode of the TFT are graphed.

Here, a relation between Id and Vds in a saturation region is represented by Expression (1):

$$Id = \beta/2(Vgs-Vth)^2(1+\lambda Vds) \quad (1)$$

Vgs: source-gate voltage
Vth: threshold voltage
β: constant
Regarding an ideal TFT, $\lambda=0$ in Expression (1).

Accordingly, as represented by the chain line of FIG. 10, Id is uniquely determined based on Vgs regardless of changes in Vds. Therefore, a stable Id output can be obtained by controlling Vgs. However, in an actual TFT, $\lambda$ is not 0 as represented by the solid line of FIG. 10, and an Id output is not constant even in the saturation region and is changed along with the change in Vds. Therefore, even in the saturation region, the line of Id-Vds characteristics is sloped. The dotted lines show extended lines from the slope of expression (1). The dotted lines cross the Vds axis at an intersection point. A difference of voltage between the intersection point and Vds origin is $1/\lambda$, and this value corresponds to an early voltage in a bipolar transistor.

In the bipolar transistor, if collector-emitter voltage (Vce: Vds in the TFT) increases, a depletion layer in a collector junction area (an area around a drain of the TFT) extends, an effective base width (effective channel length in the TFT) is reduced, and a collector current (Ic: Id in the TFT) increases. This phenomenon is called an Early effect, and a Vce value at a point where the Ic-Vce line is extrapolated to Ic=0 is called early voltage. As the current-voltage characteristics of the TFT applied to an analog circuit, it is necessary to increase the apparent early voltage ($1/\lambda$), that is, to approximate $\lambda$ to 0 to thereby stabilize the saturation region.

Figure 11:
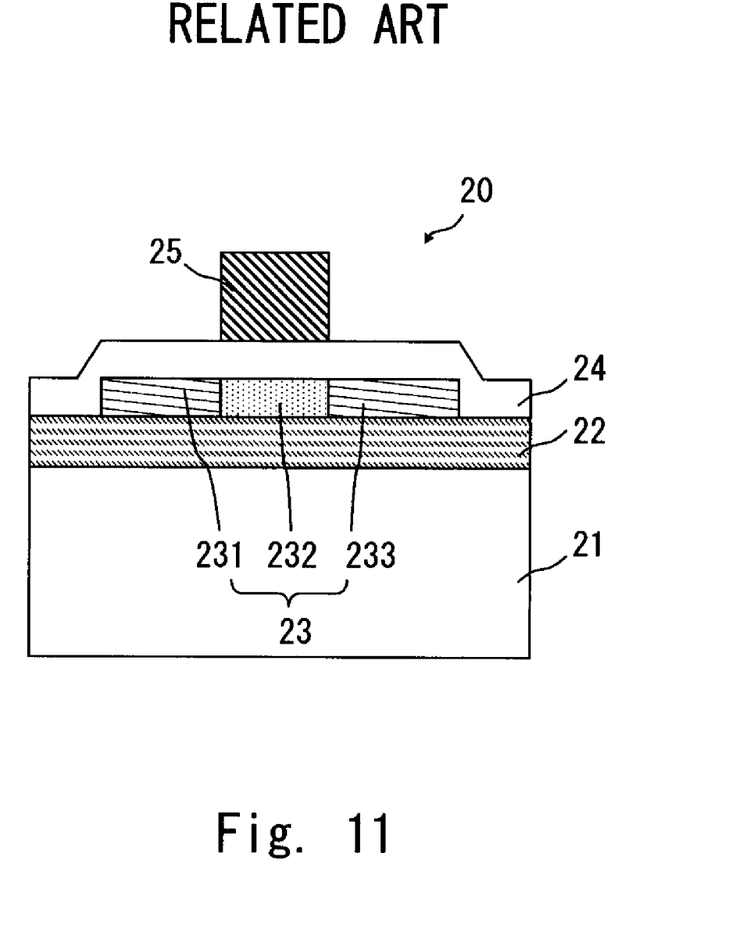
FIG. 11 is a sectional view of a structure of a conventional TFT.

Referring now to FIG. 11, a mechanism that $\lambda$ increases and the saturation region is changed is described in detail. FIG. 11 is a sectional view of the structure of a conventional TFT. In a conventional TFT 20, an insulation protective layer 22 is formed on a substrate 21, and a semiconductor layer 23 including a source region 231, a channel region 232, and a drain region 233 is formed on the insulation protective layer 22. Further, a gate insulating film 24 is formed on the semiconductor layer 23, and a gate electrode 25 is formed to cover the channel region 232 on the gate insulating film 24.

The TFT of FIG. 11 is, for example, an n-channel TFT. First of all, a voltage Vgs higher than a threshold voltage Vth is applied to the gate electrode 25. As a result, carriers are generated in an inversion layer of the channel region 232 near the gate electrode 25. In the case of the n-channel TFT, the carriers are electrons, which move in a channel while being accelerated due to an electric field generated between the source region 231 drain region 233. The accelerated electrons collide against atoms in the channel region 232 to generate a pair of hole and electron. In the generated hole-and-electron pairs, the electrons are absorbed to the drain region 233 along the electric field. Some of the holes, which are blocked by an energy barrier of the source region 231, are accumulated in the channel region 232 far from the gate electrode 25, that is, accumulated on the insulation protective layer 22 side. The accumulated holes lead to a back-gate potential, and Vth is lowered. As a result, a phenomenon that Id is further increased and $\lambda$ increases takes place.

To avoid such phenomenon, the structure for abstracting holes accumulated in a channel with an opposite conductivity layer adjacent to the channel is disclosed in Japanese Unexamined Patent Application Publication No. 2003-140570 (Tsutsumi).

As described above, in the conventional TFT, a potential of the channel region 232 in the semiconductor layer 23 is not fixed. That is, as Vds increases, carriers are accelerated to generate a larger number of hole-and-electron pairs. Further, generation of holes as minority carriers generated due to saturation region operations is promoted to increase a potential of the silicon substrate. Therefore, Id increases along with an increase in Vds, with the result that $\lambda$ increases to impair TFT stability in the saturation region. In the case of using a TFT array substrate having arrayed TFTs, for example, in the organic EL display device or the liquid crystal display device, each TFT becomes unstable, resulting in a problem that image quality of the display device varies. Further, even in the case of using the structure for abstracting holes accumulated in the channel with an opposite conductivity layer adjacent to the channel, the opposite conductivity layer is outside the gate electrode region, and a distance between a source-drain region where electrons move and the opposite conductivity layer increases. Thus, an effect of abstracting holes is small. There is another problem that a TFT area increases due to areas of the opposite conductivity layer and its wiring layer.

The present invention has been accomplished with a view to solving the above problems. The invention aims at providing a thin film transistor and a display device, which enable stable current-voltage characteristics.

SUMMARY OF THE INVENTION

A thin film transistor according to an aspect of the present invention includes: a semiconductor layer formed on a substrate and having a first diffusion region, a channel region, and a second diffusion region; a gate electrode opposite to the semiconductor layer across a gate insulating film formed on the semiconductor layer; and a connecting conductive film formed on the semiconductor layer opposite to the gate insulating film and extending from the first diffusion region up to a predetermined position in the channel region to electrically connect between the first diffusion region and the channel region.

Further, a method of manufacturing a thin film transistor according to another aspect of the invention includes: forming a connecting conductive layer on a substrate; forming a semiconductor layer including a first diffusion region, a channel region, and a second diffusion region, on the substrate including the connecting conductive layer; forming a gate insulating film on the semiconductor layer; forming a gate electrode on the gate insulating film; and introducing an impurity to the semiconductor layer to form the first diffusion region and the second diffusion region across the channel region, wherein the formation of the diffusion regions includes forming the connecting conductive layer in the first diffusion region and a predetermined area of the channel region to introduce the impurity such that the first diffusion region and the channel region are electrically connected.

Further, the thin film transistor according to the present invention further includes a laying conductive layer formed on the semiconductor layer opposite to the gate insulating film and electrically connected with the second diffusion region. Hence, a conductive impurity concentration of the first and second diffusion region is lowered.

According to the present invention, it is possible to provide a thin film transistor and a display device, which enable stable current-voltage characteristics.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

The present invention will be now described herein with reference to illustrative embodiments. For ease of explanation, the following description and the accompanying drawings are given in an abbreviated and simplified manner as appropriate, and repetitive description is omitted if not necessary.

First Embodiment

A TFT according to a first embodiment of the present invention is described with reference to the accompanying drawings. A TFT of this embodiment is a TFT used in an organic EL display device or a liquid crystal display device and having a top-gate structure where a gate is formed on a polysilicon layer.

Figure 1:
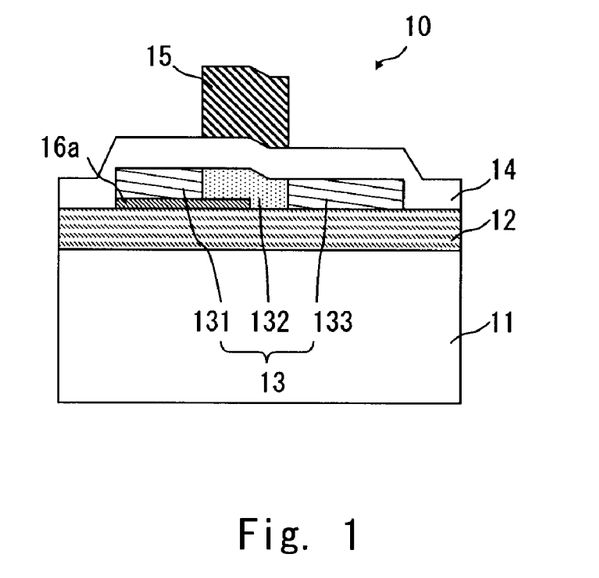
FIG. 1 is a sectional view of a structure of a TFT according to a first embodiment of the present invention.

FIG. 1 is a sectional view of the TFT of the first embodiment. A TFT 10 of FIG. 1 has an insulation protective layer 12 formed on a substrate 11. A connecting conductive film 16a is formed on the insulation protective layer 12, and a semiconductor layer 13 having a source region 131, a channel region 132, and a drain region 133 is formed thereon. Further, a gate insulating film 14 is formed on the semiconductor layer 13, and a gate electrode 15 is formed to cover a channel region 132 on the gate insulating film 14.

Therefore, the gate insulating film 14 is formed between the gate electrode 15 and the channel region 132. The gate electrode 15 is formed opposite to the channel region 132 of the semiconductor layer 13 across the gate insulating film 14. That is, the channel region 132 of the semiconductor layer 13 faces the gate electrode 15 across the gate insulating film 14. As described above, a connecting conductive film 16a is formed on the side opposite to a gate insulating film of the semiconductor layer 13 formed on the TFT 10. That is, the connecting conductive film 16a is formed between the insulation protective layer 12 and the semiconductor layer 13. The connecting conductive film 16a extends from the source region 131 to some midpoint in the channel region 132. Therefore, the connecting conductive film 16a is formed below the source region 131 and the channel region 132 to be electrically connected to the source region 131 and the channel region 132. The connecting conductive film 16a functions as a connecting conductive film connecting between the channel region 132 and the source region 131. The connecting conductive film 16a can be formed in an island shape to be isolated from other conductive layers. Alternatively, an external line for applying a predetermined potential to the connecting conductive film 16a may be connected with the film.

Although not shown, for example, the source region 131, the drain region 133, and the gate electrode 15 are connected with a line. To be specific, an interlayer insulating film is formed on the gate electrode 15. The source region 131, the drain region 133, and the gate electrode 15 are connected with a wiring layer through a contact hole formed in the gate insulating film and interlayer insulating film to configure a predetermined circuit. An upper insulating film is formed on the wiring layer, and a pixel electrode is connected with a line from the drain region 133 through the contact hole of the upper insulating film. The wiring layer is formed of, for example, aluminum (Al), and connected with the source region 131 and the drain region 133 or the gate electrode 15 to transmit image signals or control signals from the outside and in a circuit on the substrate. For example, in an active matrix type organic EL display device, 4 to 6 TFTs similar to the TFT 10 are generally included in each of pixels arranged in matrix. In each pixel, a pixel electrode connected with one of lines from the drain region 133 of the TFT 10 is provided. Then, a current flowing through an organic EL element provided between the pixel electrode and an opposing electrode is controlled in each pixel to thereby display a desired image. Incidentally, the above TFT is applicable to not only a driving TFT for supplying a driving current to the pixel electrode but also a switching TFT or other such TFTs.

Next, a specific example of a TFT manufacturing method and the structure of the TFT of the first embodiment are described. First, the substrate 11 made of light-transmissive glass is washed with pure water or acids, for example. Incidentally, the substrate 11 is not limited to glass but may be made of a light-transmissive resin such as polycarbonate or acrylic resin. Further, a metal substrate such as a SUS substrate may be used.

Next, an insulative material is deposited into a film on the substrate 11 by chemical vapor deposition (CVD), for example, to thereby form the insulation protective layer 12. The insulation protective layer 12 isolates the substrate 11 from elements on the substrate and prevents diffusion of contaminant from the substrate 11. Further, the insulation protective layer 12 suppresses interface state density between the insulation protective layer 12 and the semiconductor layer 13 overlying the layer 12 and stabilizes TFT performances. For example, a silicon nitride film having a high effect of suppressing metal diffusion is desirably formed at an interface between the metal-made substrate 11 and the insulation protective layer 12, and a silicon oxide film that hardly causes a trap level is desirably formed at an interface between the semiconductor layer 13 and the insulation protective layer 12. Incidentally, an insulation protective material other than the above materials can be, of course, used.

Subsequently, the connecting conductive film 16a is formed. First, a material for the connecting conductive film 16a is deposited into a film on the substrate 11 through sputtering or the like, and a photoresist is applied thereonto, baked, and exposed to light with a mask of a predetermined pattern. After that, the resultant is developed with an organic-alkali-based developer, for example, and the photoresist is patterned. Then, wet etching is carried out with a mixed solution of, for example, phosphoric acid and nitric acid to thereby form the connecting conductive film 16a into a desired pattern. Thereafter, the photoresist on the substrate 11 is removed, and the resulting substrate 11 is washed. Incidentally, conceivable materials for the connecting conductive film 16a are described in detail below.

Next, the semiconductor layer 13 including the source region 131, the channel region 132, and the drain region 133 is formed. As a material for the semiconductor layer 13, amorphous silicon or micro crystal silicon can be used. However, a polysilicon film of higher quality is desirable for improving a performance. Here, heat treatment at 600 degree centigrade or higher should be executed to directly form a polysilicon film to the substrate by CVD. Therefore, it is difficult to form the film on an inexpensive glass substrate. Thus, it is desirable to execute a step of forming an amorphous silicon film first on the substrate 11 by low-temperature CVD such as LPCVD or plasma CVD, and polycrystallizing the silicon film into polysilicon by laser annealing. Hence, the semiconductor layer 13 can be formed at low temperature, and a general inexpensive glass substrate can be used.

However, upon the laser annealing, a temperature at an interface between the semiconductor layer 13 and the connecting conductive film 16a is locally raised. Along with the temperature rise at the interface between the semiconductor layer 13 and the connecting conductive film 16a, substances of the connecting conductive film 16a and the semiconductor layer 13 mutually diffuse. As a result, there is a fear that the semiconductor layer 13 is contaminated with a metal layer substance and operating characteristics of the TFT are deteriorated. Therefore, a material resistant to high temperature is desirable for the connecting conductive film 16a.

Examples of the connecting conductive film 16a include high-melting-point metal such as titanium (Ti), tantalum (Ta), tungsten (W), or molybdenum (Mo) and metal nitride such as titanium nitride (TiN), tantalum nitride (TaN), tungsten nitride (WN), molybdenum nitride (MoN), zirconium nitride (ZrN), vanadium nitride (VN), hafnium nitride (HfN), or niobium nitride (NbN).

Further, if there is a possibility that substances are mutually diffused between the silicon film and the connecting conductive film 16a, it is desirable to use substances that are less mutually diffused to silicon. Therefore, as a material for the connecting conductive film 16a, for example, TiN, TaN, WN, MoN, ZrN, VN, HfN, NbN, and a complex nitride compound of these elements are desirable. Incidentally, these materials may be laminated.

Next, the gate insulating film 14 is formed on the semiconductor layer 13. As the gate insulating film 14, it is desirable to use a silicon oxide film to suppress the interface state density between the film 14 and the semiconductor layer 13. In addition, considering thermal strain of glass as a material for the substrate 11, it is preferred to form a film with low-temperature CVD. Incidentally, needless to say, films other than the silicon oxide film can be used as the gate insulating film 14 and TFT manufacturing processes other than the low-temperature CVD can be used.

Next, the gate electrode 15 is formed on the gate insulating film 14. As the gate electrode 15, for example, molybdenum tantalum (MoTa) is deposited into a film through sputtering. Next, a MoTa film is processed into a predetermined shape by photoetching. At the time of etching the MoTa film, for example, wet etching is desirable with a mixed solution of phosphoric acid and nitric acid.

After the formation of the gate electrode 15, for example, impurities such as phosphorous (P) and boron (B) are injected to form the source region 131 and drain region 133. As the introducing method, ion implantation or ion doping can be carried out. The TFT is completed through the above process.

Incidentally, it is important that the connecting conductive film 16a electrically connects the source region 131 and the channel region 132. In addition, the connecting conductive film 16a needs to avoid the contact with the drain region 133 and a depletion layer (not shown) extending from drain region 133. That is, the connecting conductive film 16a is formed away from the depletion layer that grows at the time of applying a gate voltage. This is because, if the drain region 133 and the depletion layer extending from the drain region 133 are brought into contact with the connecting conductive film 16a during operations of the TFT, a leak current is generated. Therefore, the connecting conductive film 16a should be formed outside an area where the depletion layer extends. Further, it is necessary to consider that the depletion layer grows a little even if no voltage is applied.

As is understood from the above, the connecting conductive film 16a in the channel region 132 desirably extends 0.5 μm or more from the interface between the source region 131 and the channel region 132 toward the channel region 132. Further, connecting conductive film 16a is desirably formed 3 μm or more away from the interface between the drain region 133 and the channel region 132.

As described above, in the structure of this embodiment as shown in FIG. 1, the connecting conductive film 16a is formed below the source region 131 and the channel region 132. Thus, an increase in potential of the channel region 132 in the semiconductor layer 13 is suppressed to reduce λ to thereby realize a TFT having stable current-voltage characteristics. That is, owing to the connecting conductive film 16a, holes are not accumulated but moved to the source region, making is possible to prevent Vth from lowering due to accumulated holes and to stabilize the current-voltage characteristics. In particular, the above is suitable for a current-controlled organic EL display device.

Second Embodiment

Figure 2:
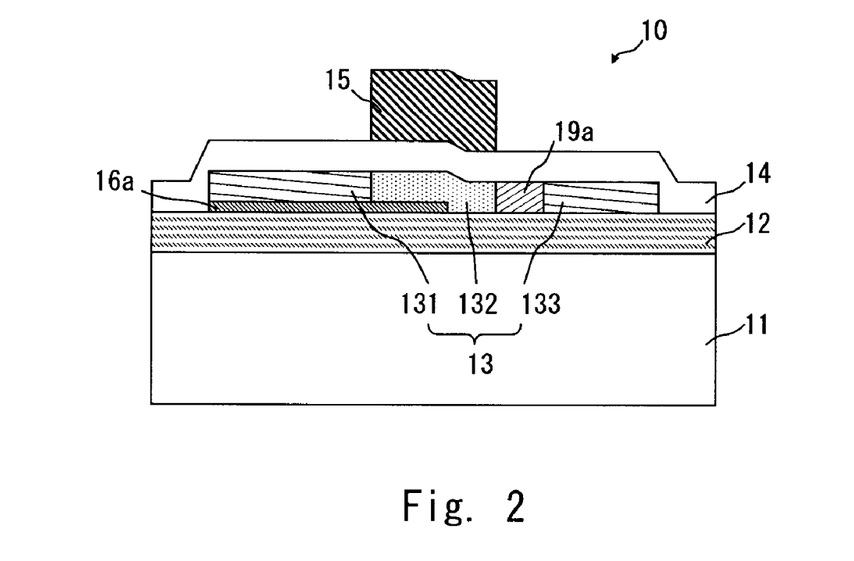
FIG. 2 is a sectional view of a TFT having an LDD structure according to a second embodiment of the present invention.

Referring next to the drawings, a second embodiment of the present invention is described. A TFT of this embodiment has an LDD (Lightly Doped Drain) structure. The LDD structure is the top-gate structure similar to the first embodiment. However, in this structure, the channel region 132 is not directly connected to the source region 131 and the drain region 133, and a region of an impurity concentration lower than those of the source region 131 and the drain region 133 is formed at the edge of the gate. Thus, this structure reduces electric field intensity at the interface between the drain region 133 and the channel region 132 and has an effect of increasing a breakdown voltage and reliability of the TFT.

FIG. 2 is a sectional view of the TFT having the LDD (Lightly Doped Drain) structure of the second embodiment. The same components of the TFT as those of the first embodiment are omitted here. As shown in FIG. 2, in addition to the components as illustrated in the sectional view of FIG. 1, in the second embodiment, a low-concentration region 19a is formed in the channel region 132 in contact with the drain region 133. This region has an effect of mitigating the electric field near the drain region 133. The low-concentration region 19a is formed by introducing impurities such as phosphorous (P) and boron (B), for example.

Figure 3:
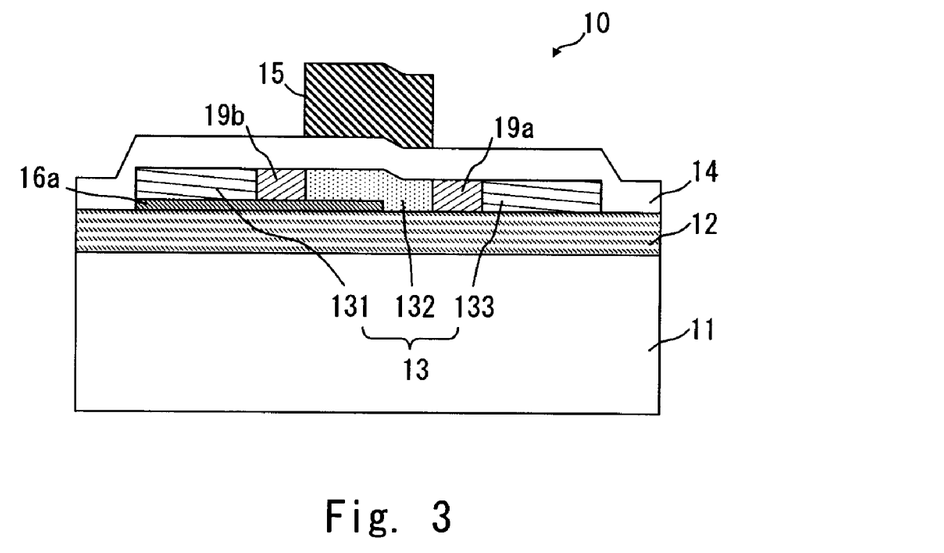
FIG. 3 is a sectional view of another example of the TFT having the LDD structure of the second embodiment.

FIG. 3 is a sectional view of another example of the TFT having the LDD structure. In the illustrated example of FIG. 3, in addition to the components as shown in the sectional view of FIG. 2, a low-concentration region 19b is formed in the source region 131 in contact with the channel region 132. In this structure, ions are selectively implanted with the gate electrode 15 used as a mask to thereby form source/drain regions 131 and 133. After that, the gate electrode 15 is over-etched to remove the gate electrode 15 on the LDD region. Ions are selectively implanted in low concentration with the gate electrode 15 used as a mask again to thereby form an LDD region. Therefore, as compared with the structure of FIG. 2, a transferring step can be skipped in a manufacturing process and the process can be simplified albeit a high parasitic resistance on the source side.

Owing to the low-concentration region 19a, field intensity near the drain region 133 is reduced, and hot carrier generation at an interface between the channel region 132 and the drain region 133 is suppressed. However, the formation of the low-concentration regions 19a and 19b leads to a problem that a parasitic resistance at the junction increases.

Figure 4:
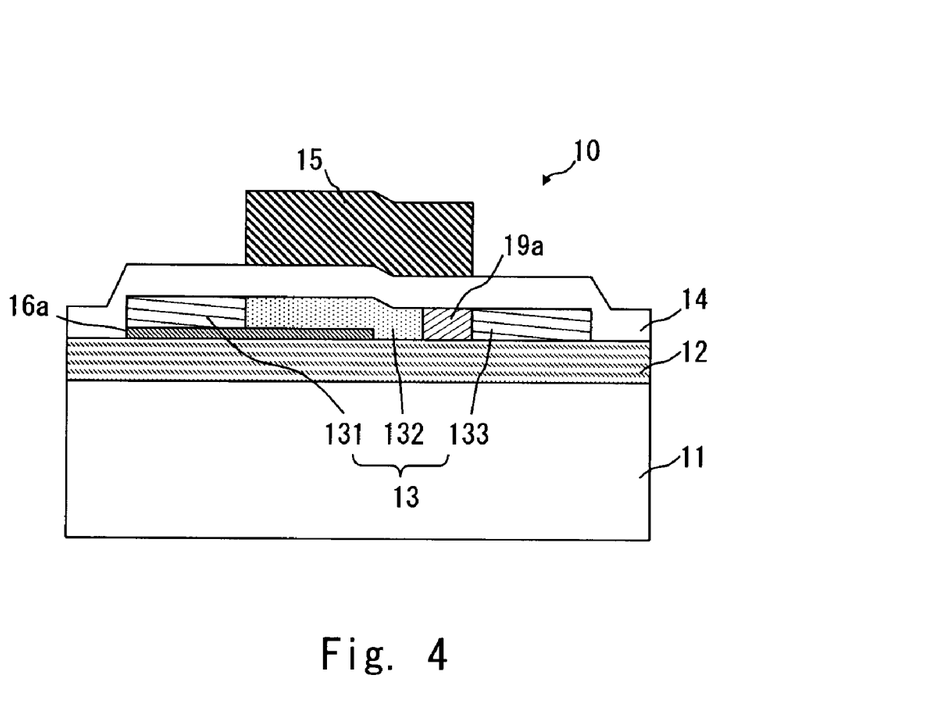
FIG. 4 is a sectional view of a TFT having a GOLD structure of the second embodiment.

To overcome the problem, the structure for reducing the parasitic resistance due to the low-concentration region is described below. FIG. 4 is a sectional view of a TFT having a GOLD (Gate Overlapped LDD) structure of the second embodiment. In the illustrated structure of FIG. 4, the gate electrode 15 extends up to an area above the low-concentration region 19a aside from the structure as shown in the sectional view of FIG. 2. Therefore, a gate voltage of the gate electrode 15 is applied to the low-concentration region 19a as well. As a result, carriers of the low-concentration region 19a increase.

Figure 5:
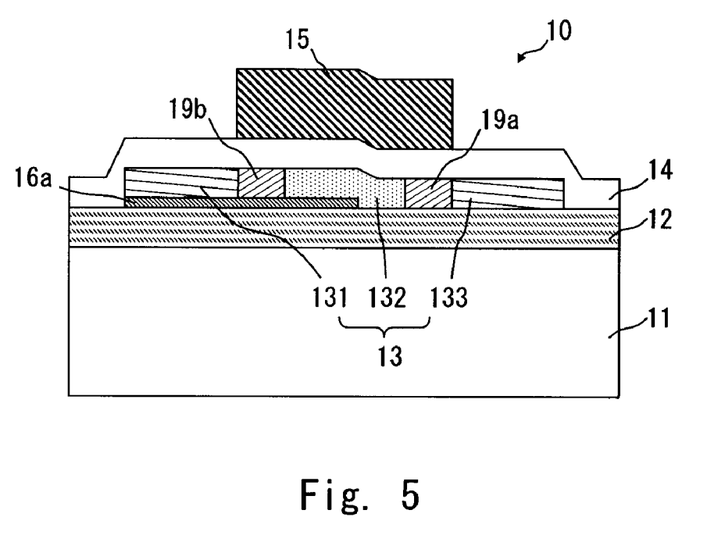
FIG. 5 is a sectional view of another example of the TFT having the GOLD structure of the second embodiment.

FIG. 5 is a sectional view of another example of the TFT having the GOLD structure. In the illustrated example of FIG. 5, in addition to the components as shown in the sectional view of FIG. 4, the low-concentration region 19b is also formed in the source region 131 in contact with the channel region 132. The gate electrode 15 extends to an area above the low-concentration region 19b. Therefore, a gate voltage of the gate electrode 15 is applied to the low-concentration region 19a and 19b, and carriers in the low-concentration region 19b as well as the low-concentration region 19a increase.

As described above, in the structure of this embodiment as shown in FIG. 2, the low-concentration region 19a is formed in the drain region 133 outside the channel region 132. As a result, an impurity concentration of the drain region 133 is lowered, and electric field intensity around the drain is reduced. Therefore, carrier acceleration is suppressed, and the number of hole-and-electron pairs is reduced. As a result, due to an effect of the LDD as well as the effect of the connecting conductive film 16a, λ can be lowered.

Further, in the structure of this embodiment as shown in FIG. 3, the low-concentration regions 19a and 19b are formed in both of the source region 131 and the drain region 133. Similar to the example of FIG. 2, intensity of a drain electric field of the TFT is reduced, and the current-voltage characteristics can be stabilized. However, as described above, an advantage in manufacturing process is attained as compared with the example of FIG. 2.

Further, in the structure of this embodiment as shown in FIG. 4, a voltage is applied to the low-concentration region 19a due to the GOLD structure. Thus, carriers of the low-concentration region 19a increase, and a parasitic resistance of the semiconductor layer 13 can be reduced.

Further, in the structure of this embodiment as shown in FIG. 5, the low-concentration regions 19a and 19b are formed in both of the source region 131 and the drain region 133 in the GOLD structure. Hence, even in the low-concentration region 19b of the source region 131, a parasitic resistance can be reduced as in the drain region 133.

Third Embodiment

Figure 6:
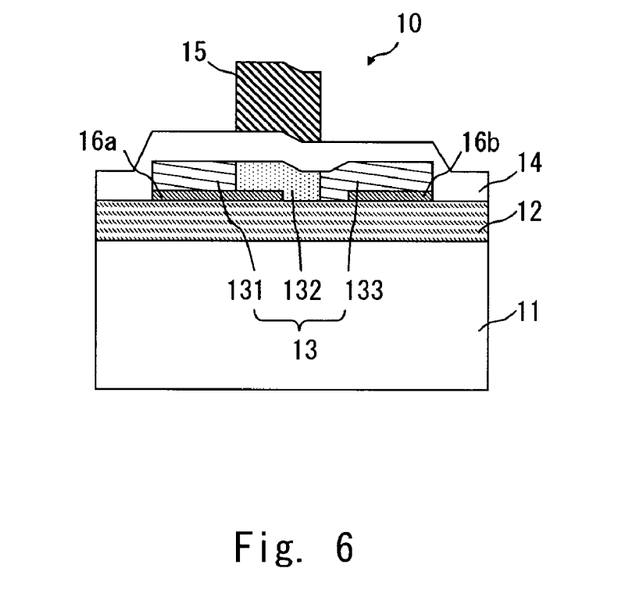
FIG. 6 is a sectional view of a structure of a TFT according to a third embodiment of the present invention.

Next, a third embodiment of the present invention is described with reference to the drawings. A TFT of this embodiment is a TFT used in an organic EL display device or a liquid crystal display device and has the top-gate structure where a gate is formed on a polysilicon layer as in the first embodiment. FIG. 6 is a sectional view of the TFT of the third embodiment. Description about the components of the TFT as those of the first embodiment is omitted here.

As shown in FIG. 6, in the third embodiment, a laying conductive layer 16b is formed below the drain region 133 as well as the source region 131 and the channel region 132. That is, the laying conductive layer 16b is formed opposite to the gate insulating film 14 to be electrically connected with the drain region 133. A method and material for forming the laying conductive layer 16b are the same as those of the connecting conductive film 16a. Thus, the connecting conductive film 16a and the laying conductive layer 16b can be formed with the same step, and the number of steps in a manufacturing process can be reduced.

A main feature of the third embodiment resides in a conductive film underlying the diffusion region. Thus, an effective concentration of conductive impurities in the diffusion region can be lowered without increasing a resistance of the diffusion region. The effective concentration of conductive impurities in the diffusion region is preferably $1\times10^{17}/cm^3$ or less. A lower impurity concentration in the diffusion region leads to reduction in electric field intensity at the interface of the channel region, and carrier acceleration due to the electric field is suppressed to reduce the number of hole-and-electron pairs.

Incidentally, the laying conductive layer 16b needs to be formed not in contact with the channel region 132. That is, the laying conductive layer 16b is formed away from the depletion layer that grows at the time of applying a gate voltage. This is because, if the laying conductive layer 16b comes into contact with the channel region 132 during the TFT operation, a leak current is generated. Therefore, the laying conductive layer 16b should be formed outside an extendable area of the depletion layer. In particular, in the case where an impurity concentration in the diffusion region is reduced, a possibility that the depletion layer expands even if no voltage is applied should be taken into consideration.

As is understood from the above, the laying conductive layer 16b in the drain region 133 is desirably formed at least 3 μm away from the interface between the channel region 132 and the drain region 133.

Figure 7:
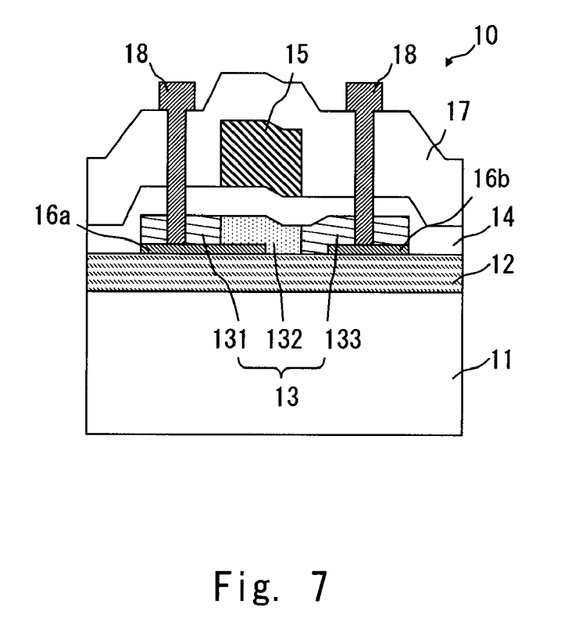
FIG. 7 is a sectional view of another structure of the TFT of the third embodiment.

An advantage of the structure of FIG. 6 is described next with reference to FIG. 7. FIG. 7 shows the connection between the source region 131 and the drain region 133 in addition to the components as shown in the sectional view of FIG. 6, and illustrates the interlayer insulating film 17 and the line 18. For example, the lines 18 connected with the source region 131 and the drain region 133 function as signal lines and control lines. The line 18 connected with the drain region 133 is partially connected with a pixel electrode (not shown) on an upper insulating film (not shown) covering the line 18 through a contact hole (not shown). The interlayer insulating film 17 is formed on the gate insulating film 14 and the gate electrode 15. To connect the lines 18 to the source region 131 and the drain region 133, it is necessary to form a contact hole in the interlayer insulating film 17. Considering a material for the interlayer insulating film 17 or a microscopic contact hole, dry etching is used for forming the contact hole.

At the time of etching the interlayer insulating film 17 and the semiconductor layer 13, since layers differ from each other in thickness, an etching rate should be controlled. However, an etching speed varied depending on a material, so it is difficult to increase an etching speed ratio between the interlayer insulating film 17 and the semiconductor layer 13. Therefore, upon etching the film to form a contact hole, the semiconductor layer 13 may be etched. This causes a problem that electrical connection between the line 18 and the semiconductor layer 13 becomes unstable. Accordingly, the connecting conductive film 16a and the laying conductive layer 16b are formed below the contact hole to thereby serve as an etching stopper. Thus, a contact resistance of the line 18 and the semiconductor layer 13 is lowered to stabilize the connection state.

Figure 8:
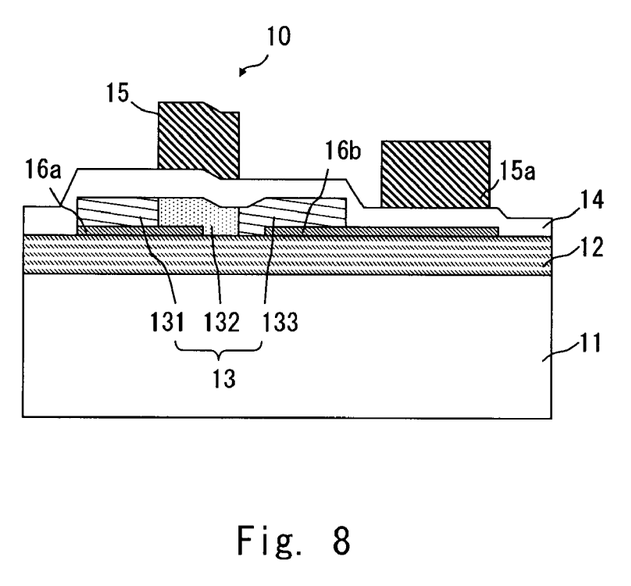
FIG. 8 is a sectional view of another structure of the TFT of the third embodiment.

FIG. 8 is a sectional view of another example of the TFT of the third embodiment. In the illustrated example of FIG. 8, the laying conductive layer 16b below the semiconductor layer 13 in the sectional view of FIG. 6 protrudes from the semiconductor layer 13. In addition, the gate insulating film 14 is formed above the protruded laying conductive layer 16b. Further, an electrode 15a is formed above the laying conductive layer 16b through the gate insulating film 14. The electrode 15a is formed together with the gate electrode 15. The electrode 15a is an upper capacitor electrode, and the laying conductive layer 16b is a lower capacitor electrode to thereby form a capacitor. Hence, a retentive capacity is obtained.

Incidentally, the electrode 15a as the upper capacitor electrode can be readily made of the same material with the same thickness as the gate electrode 15 but may be, of course, made of other materials with a different thickness. The upper capacitor electrode 15a can be a capacitor electrode for compensating circuit that compensates for variations in Vth.

Figure 9:
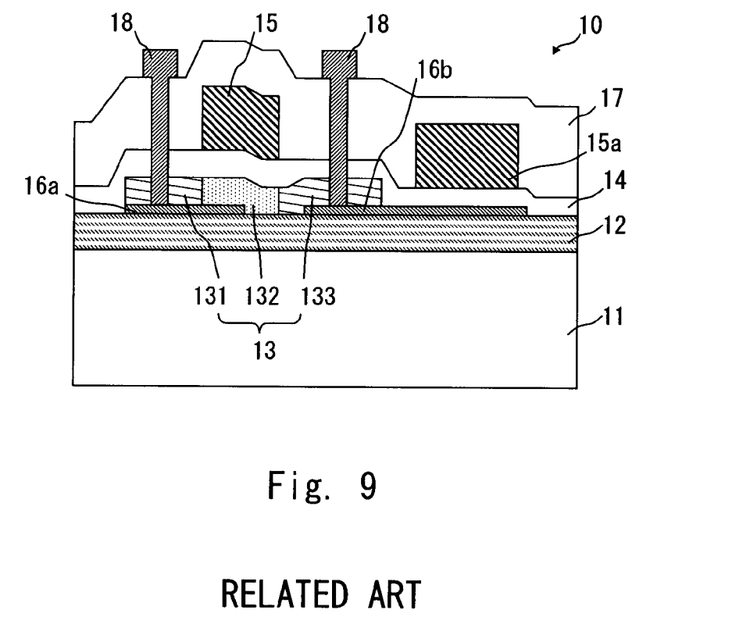
FIG. 9 is a sectional view of another structure of the TFT of the third embodiment.

FIG. 9 is a sectional view of another example of the TFT of the third embodiment. FIG. 9 shows the connection between the source region 131 and the drain region 133 in addition to the components as shown in the sectional view of FIG. 8, and illustrates the interlayer insulating film 17 and the line 18. As also shown in FIG. 7, it is necessary to form a contact hole in the interlayer insulating film 17 by dry etching to connect the line 18 to the source region 131 and the drain region 133.

However, since it is difficult to control the etching speed, the semiconductor layer 13 is too etched in some cases, resulting in a problem in that and electrical connection between the line 18 and the semiconductor layer 13 becomes unstable. Hence, the connecting conductive film 16a and the laying conductive layer 16b are formed below the contact hole and thus serve as an etching stopper to stabilize the connection between the line 18 and the semiconductor layer 13. This produces beneficial effects similar to the effects of the structure of FIG. 7. Further, the laying conductive layer 16b and the electrode 15a constitute a retentive capacity. This produces beneficial effects similar to the effects of the structure of FIG. 8.

As described above, in the structure of this embodiment as shown in FIG. 6, the laying conductive layer 16b is formed below not only the source region 131 and the channel region 132 but also below the drain region 133. Thus, an effective concentration of diffusion regions in the source region 132 and the drain region 133 can be reduced. The lower concentration leads to reduction in electric field intensity at the interface of the channel region, and the carrier acceleration due to an electric field is suppressed to reduce the number of hole-and-electron pairs. Further, a parasitic resistance of the drain region 133 can be reduced. As a result, a driving current of the TFT can be increased, and the TFT can operate at high speeds with low power consumption.

Further, in the structure of this embodiment as shown in FIG. 7, a contact hole is formed above the connecting conductive film 16a and the laying conductive layer 16b. Hence, the connecting conductive film 16a and the laying conductive layer 16b serve as a dry-etching stopper. Therefore, an effect of preventing over-etching or the like and an effect of connecting between the semiconductor layer 13 and the line 18 with reliability can be obtained.

Further, in the structure of this embodiment as shown in FIG. 8, the laying conductive layer 16b protrudes from the semiconductor layer 13, and the electrode 15a is formed above the laying conductive layer 16b through the gate insulating film 14. Thus, the laying conductive layer 16b functions as a lower capacitor electrode with a low capacitance resistance to thereby obtain a capacitor with a series resistance. Owing to the capacitor, an apparent breakdown voltage of the gate electrode 15 increases to protect the gate insulating film 14 against breakdown. Incidentally, as for a material for the gate insulating film 14, the present invention is not limited to the same material as the TFT, and an insulating film having a large dielectric constant such as a silicon nitride film can be used. As a result, the breakdown voltage of the electrode 15a further increases to realize a stable TFT.

Further, in the structure of this embodiment as shown in FIG. 9, similar to the structure of FIG. 7, a contact hole is formed above the connecting conductive film 16a and the laying conductive layer 16b. As a result, the connecting conductive film 16a and the laying conductive layer 16b serve as a dry-etching stopper. Therefore, an effect of preventing overetching or the like and an effect of connecting between the semiconductor layer 13 and the line 18 with reliability to reduce a contact resistance can be obtained. Further, since the laying conductive layer 16b protrudes from the semiconductor layer 13, such a beneficial effect that the structure can be used in a circuit as a low-resistance three-dimensional wiring structure is obtained.

A specific example of a TFT manufacturing method of the third embodiment is described next. The specific example of a TFT manufacturing method of the third embodiment is substantially the same as that of the first embodiment, so description is focused on a difference therebetween. Upon forming the connecting conductive film 16a on the substrate 11, the laying conductive layer 16b is concurrently formed. After the formation of the gate electrode 15, for example, impurities such as phosphorous (P) and boron (B) are introduced to form the source region 131 and the drain region 133. As an introducing method, ion implantation or ion doping can be used. At this time, an effective conductive impurity concentration of the source region 131 and the drain region 133 formed in the semiconductor layer 13 is desirably set to $1 \times 10^{17}/cm^3$ or less. Through the above process, the TFT is completed.

Incidentally, the same structures as the first embodiment and the third embodiment are applicable to the TFT of the second embodiment. For example, even in the TFT of the LDD structure or the GOLD structure, a laying conductive layer (not shown) may be formed below the drain region 133 as well as the source region 131 and the channel region 132. The formation and position of the laying conductive layer are similar to those of the third embodiment, but if the laying conductive layer 16b extends into the LDD region 19a, an effect of the LDD is lowered. This should be taken into account. Owing to such structure, the parasitic resistance of the drain region 133 can be further reduced.

Further, even in the TFT of the LDD structure or GOLD structure, an interlayer insulating film (not shown) and a line (not shown) may be formed to connect between the source region 131 and the drain region 133. In this case, the connecting conductive film 16a stops dry etching to form a contact hole to stabilize connection between the line and the semiconductor layer 13. In case a laying conductive layer (not shown) is formed below the drain region 133, the laying conductive layer also stops dry etching to form a contact hole to stabilize connection between the line and the semiconductor layer 13.

Further, even in the TFT of the LDD structure or GOLD structure, if the laying conductive layer is formed below the drain region 133, the laying conductive layer can protrude from the semiconductor layer 13 (not shown). In addition, a gate insulating film may be formed above the protruded laying conductive layer to form an electrode through the gate insulating film. As a result, the electrode becomes a capacitor of the gate electrode 15, and a stable TFT is obtained.

The TFT of the first to third embodiments is suitable especially for an organic EL display device. Incidentally, the present invention is applicable to not only the top-gate type TFT but also a bottomgate type TFT.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A thin film transistor, comprising:
   a semiconductor layer formed on a substrate and having a first diffusion region, a channel region, and a second diffusion region;
   a gate electrode opposite to the semiconductor layer across a gate insulating film formed on the semiconductor layer; and
   a connecting conductive film formed under the semiconductor layer opposite to the gate insulating film and extending from the first diffusion region up to a predetermined position in the channel region to electrically connect between the first diffusion region and the channel region.

2. The thin film transistor according to claim 1, wherein the connecting conductive film is formed away from a depletion layer that grows upon applying a voltage at an interface between the second diffusion region and the channel region.

3. The thin film transistor according to claim 1, wherein the connecting conductive film contains high-melting-point metal or metal nitride.

4. The thin film transistor according to claim 1, wherein the connecting conductive film contains at least one metal selected from the group consisting of Ti, Ta, W, Mo, TiN, TaN, WN, MoN, ZrN, VN, and HfN.

5. The thin film transistor according to claim 1, wherein a low-concentration region having an impurity concentration lower than a concentration of the first and second diffusion regions is formed between the channel region and the first diffusion region and between the channel region and the second diffusion region.

6. The thin film transistor according to claim 1, further comprising:
   a laying conductive layer formed on the semiconductor layer opposite to the gate insulating film and electrically connected with the second diffusion region.

7. The thin film transistor according to claim 6, wherein the laying conductive layer is formed away from a depletion layer that grows upon applying a voltage at an interface between the second diffusion region and the channel region.

8. The thin film transistor according to claim 6, further comprising:
   a capacitor composed of the laying conductive layer protruded from the second diffusion region, the gate insulating film, and the gate electrode.

9. The thin film transistor according to claim 6, wherein a low-concentration region having an impurity concentration lower than a concentration of the first and second diffusion regions is formed between the channel region and the first diffusion region and between the channel region and the second diffusion region.

10. The thin film transistor according to claim 6, wherein the connecting conductive film and the laying conductive layer are formed of the same material.

11. The thin film transistor according to claim 6, wherein the laying conductive layer contains high-melting-point metal or metal nitride.

12. The thin film transistor according to claim 6, wherein the laying conductive layer contains at least one metal selected from the group consisting of Ti, Ta, W, Mo, TiN, TaN, WN, MoN, ZrN, VN, and HfN.

13. The thin film transistor according to claim 6, wherein an effective concentration of conductive impurities in the first and second diffusion regions is about $1 \times 10^{17}/cm^3$ or less.

14. A method of manufacturing a thin film transistor, comprising:
   forming a connecting conductive layer on a substrate;
   forming a semiconductor layer including a first diffusion region, a channel region, and a second diffusion region, on the substrate including the connecting conductive layer;
   forming a gate insulating film on the semiconductor layer;
   forming a gate electrode on the gate insulating film; and introducing an impurity to the semiconductor layer to form the first diffusion region and the second diffusion region across the channel region, wherein the formation of the connecting conductive layer includes forming the connecting conductive layer which is formed under the semiconductor layer opposite to the gate insulating film to electrically connect between the first diffusion region and the channel region.

15. The method of manufacturing a thin film transistor according to claim 14, further comprising:

forming a laying conductive layer on the substrate, which is electrically connected to the second diffusion region prior to the formation of the semiconductor layer.

16. A display device comprising a thin film transistor according to claim 1.

* * * * *